US009164632B2

(12) United States Patent
Lo et al.

(10) Patent No.: US 9,164,632 B2
(45) Date of Patent: Oct. 20, 2015

(54) TOUCH PANEL

(71) Applicant: HTC Corporation, Taoyuan County (TW)

(72) Inventors: Pi-Lin Lo, Taoyuan County (TW);
Yen-Cheng Lin, Taoyuan County (TW);
Te-Mu Chen, Taoyuan County (TW);
Yi-Fan Hsueh, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 142 days.

(21) Appl. No.: 13/684,580

(22) Filed: Nov. 26, 2012

(65) Prior Publication Data
US 2013/0176278 A1    Jul. 11, 2013

Related U.S. Application Data

(60) Provisional application No. 61/584,303, filed on Jan. 8, 2012.

(51) Int. Cl.
*G06F 3/044* (2006.01)
*H03K 17/96* (2006.01)

(52) U.S. Cl.
CPC ...... *G06F 3/044* (2013.01); *G06F 2203/04107* (2013.01); *H03K 17/962* (2013.01)

(58) Field of Classification Search
CPC .......... G06F 2203/04107; G06F 3/041; G06F 3/044; H03K 17/962; H03K 17/96
See application file for complete search history.

(56) References Cited

U.S. PATENT DOCUMENTS

| 2009/0091551 | A1 | 4/2009 | Hotelling et al. | |
|---|---|---|---|---|
| 2009/0267916 | A1 | 10/2009 | Hotelling | |
| 2009/0314105 | A1* | 12/2009 | Dattalo et al. | 73/862.626 |
| 2011/0017523 | A1* | 1/2011 | Bulea et al. | 178/18.06 |
| 2013/0154991 | A1* | 6/2013 | Yilmaz | 345/174 |

FOREIGN PATENT DOCUMENTS

| CN | 101866250 | 10/2010 |
|---|---|---|
| CN | 102209945 | 10/2011 |
| TW | M374618 | 2/2010 |
| TW | 201019184 | 5/2010 |
| TW | M390521 | 10/2010 |
| TW | 201044241 | 12/2010 |

OTHER PUBLICATIONS

"Office Action of Taiwan Counterpart Application", issued on Aug. 27, 2014, p. 1-p. 4.
"Office Action of China Counterpart Application", issued on Jun. 25, 2015, p. 1-p. 5.

* cited by examiner

*Primary Examiner* — William Boddie
*Assistant Examiner* — Bryan Earles
(74) *Attorney, Agent, or Firm* — Jianq Chyun IP Office (57) ABSTRACT

A touch panel including a substrate, first connecting pads, circuit units, and ground lines is provided. Each circuit unit includes a signal line, first electrodes, second electrodes, first connecting lines, and second connecting lines. The signal line extends along a first direction and includes a first portion and a second portion. The first portion is located between a first side of the substrate and the second portion. The first electrodes are disposed beside the first portion, and the second electrodes are disposed beside the second portion. The first connecting lines respectively connect the first electrodes to the corresponding first connecting pads. The second connecting lines respectively connect the second electrodes to the corresponding first connecting pads through a trace region located beside the first portion, wherein the trace region and the first electrodes are respectively located at two opposite sides of the first portion.

20 Claims, 5 Drawing Sheets

TOUCH PANEL

CROSS-REFERENCE TO RELATED APPLICATION

The application claims the priority benefits of U.S. provisional application Ser. No. 61/584,303, filed on Jan. 8, 2012. The entirety of the above-mentioned patent applications is hereby incorporated by reference herein and made a part of this specification.

BACKGROUND

1. Field of the Application

The application relates to a touch panel, and more particular, to a capacitive touch panel.

2. Description of Related Art

In recent years, following rapid developments and applications of information technology, wireless mobile communications and information appliances, in order to achieve objectives of being more convenient, lighter volume and more humane, many information products have transformed from using a traditional input device, such as keyboard or mouse, to a touch panel.

The touch panel in accordance with different sensing mechanisms may generally be categorized as resistive touch panel, capacitive touch panel, optical touch panel, acoustic wave touch panel and electromagnetic touch panel. Since the capacitive touch panel, as compared to the other types of touch panel, has advantages of fast response time, favorable reliability and high definition, it is broadly been applied to various types of hand-held electronic device.

The capacitive touch panel constitutes a sensing array via a plurality of intertwined linear electrodes so as to achieve a surface sensing. When a user contacts the touch panel with a finger, the touch panel determines a location in contact with the finger according to a capacitance change on the sensing array. Peripheral circuits or connecting lines of the sensing electrodes of a conventional touch panel occupy a layout space on a substrate, and therefore, a circuit layout on the substrate still has room for improvement.

SUMMARY OF THE APPLICATION

The application provides a touch panel capable of effectively using a layout space on a substrate, and has favorable touch quality.

The application provides a touch panel including a substrate, a plurality of first connecting pads, a plurality of circuit units and a plurality of ground lines. The substrate has a first side and a second side opposite the first side. The first connecting pads are disposed on the substrate and neighboring the first side of the substrate. The circuit units respectively extend between the first side and second side along a first direction, and are arranged side-by-side on the substrate along a second direction, wherein the first direction intersects the second direction. Each circuit unit includes a signal line, a plurality of first electrodes, a plurality of second electrodes, a plurality of first connecting lines and a plurality of second connecting lines. The signal line extends along the first direction and includes a first portion and a second portion. The first portion is located between the first side and the second portion. The first electrodes are disposed beside the first portion of the signal line and coupled with the first portion. The second electrodes are disposed beside the second portion of the signal line and coupled with the second portion, and the first electrodes and the second electrodes are respectively located at the two opposite sides of the signal line. The first connecting lines respectively connect the first electrodes to the corresponding first connecting pads; the second connecting lines pass through a trace region located beside the first portion and respectively connect the second electrodes to the corresponding first connecting pads. Wherein, the trace region and the first electrodes are respectively located at two opposite sides of the first portion. The ground lines are disposed on the substrate and respectively extend along the first direction, wherein any two adjacent circuit units are provided with one of the ground lines therebetween.

According to the foregoing, in a display unit of the touch panel of the application, the first electrodes and the second electrodes are respectively located the two sides of the signal line, and the first electrodes are closer to the first connecting pads than the second electrodes. With such layout, via disposing the trace region passing through by the second connecting lines at a side of the signal line and opposite to the first electrodes, an effective use of the layout space is achieved.

In addition, a configuration of the ground lines may avoid two adjacent circuit units from having signal interferences with each other, and linewidth and line distance designs of the first connecting lines and the second connecting lines may improve an impedance of a circuit layout of the touch panel. A configuration of each dummy pattern may improve a light transmittance uniformity of the touch panel. Moreover, the first portion, the second portion, and jagged structures of the first electrodes and the second electrodes may increase a coupling capacity required for sensing. Accordingly, the touch panel may provide a user with favorable touch quality.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DETAILED DESCRIPTION OF DISCLOSED EMBODIMENTS

Figure 1:
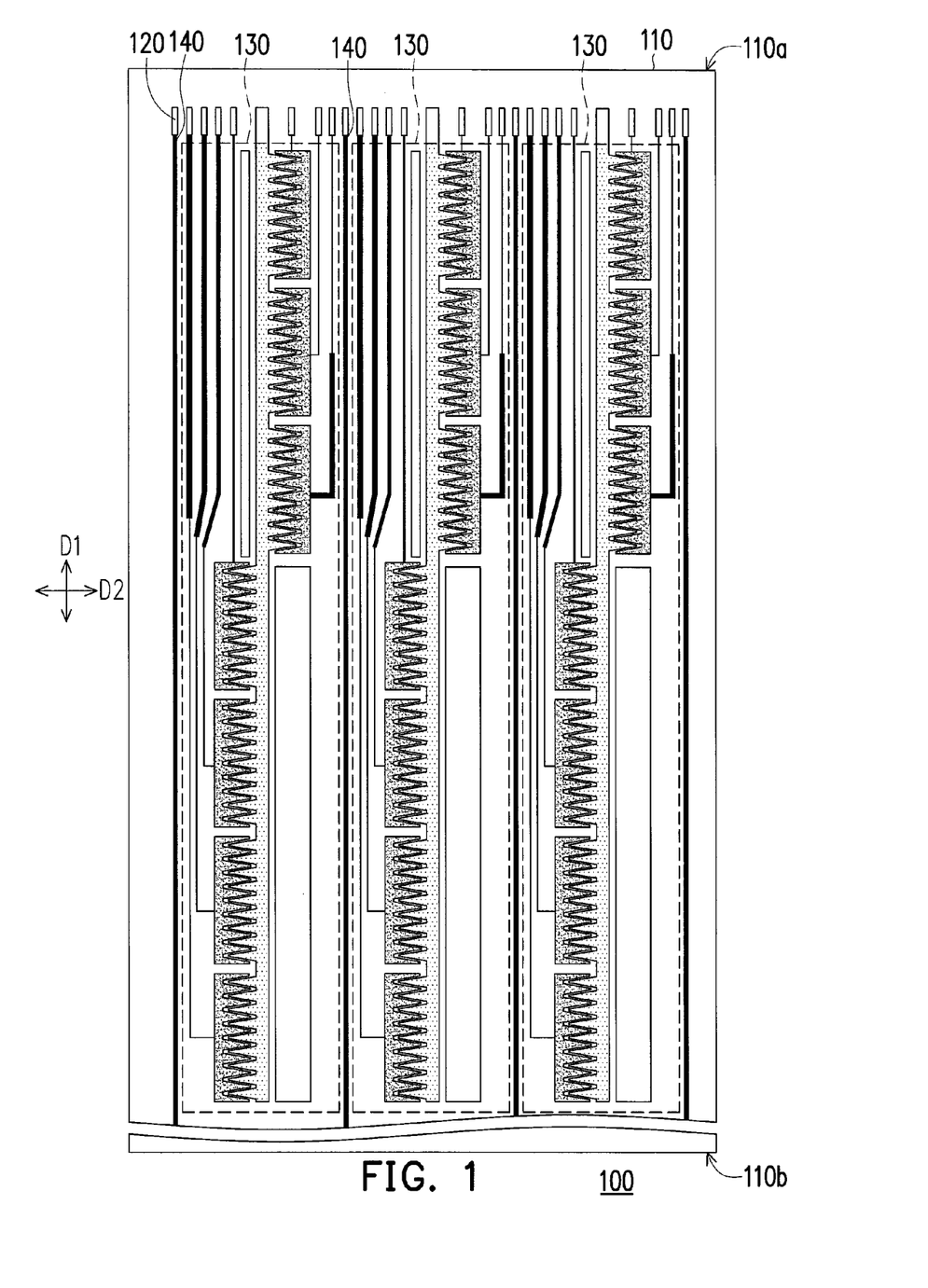
FIG. 1 is a schematic diagram illustrating a touch panel according to an embodiment of the application.

FIG. 1 is a schematic diagram illustrating a touch panel according to an embodiment of the application. Referring to FIG. 1, a touch panel 100 includes a substrate 110, a plurality of first connecting pads 120, a plurality of circuit units 130 and a plurality of ground lines 140. The substrate 110 has a first side 110a and a second side 110b opposite the first side 110a. The first connecting pads 120 are disposed on the substrate 110 and neighboring the first side 110a of the substrate 110. The circuit units 130 respectively extend between the first side 110a and the second side 110b along a first direction D1, and arranged side-by-side on the substrate 110 along a second direction D2, wherein the first direction D1 intersects the second direction D2.

Figure 2:
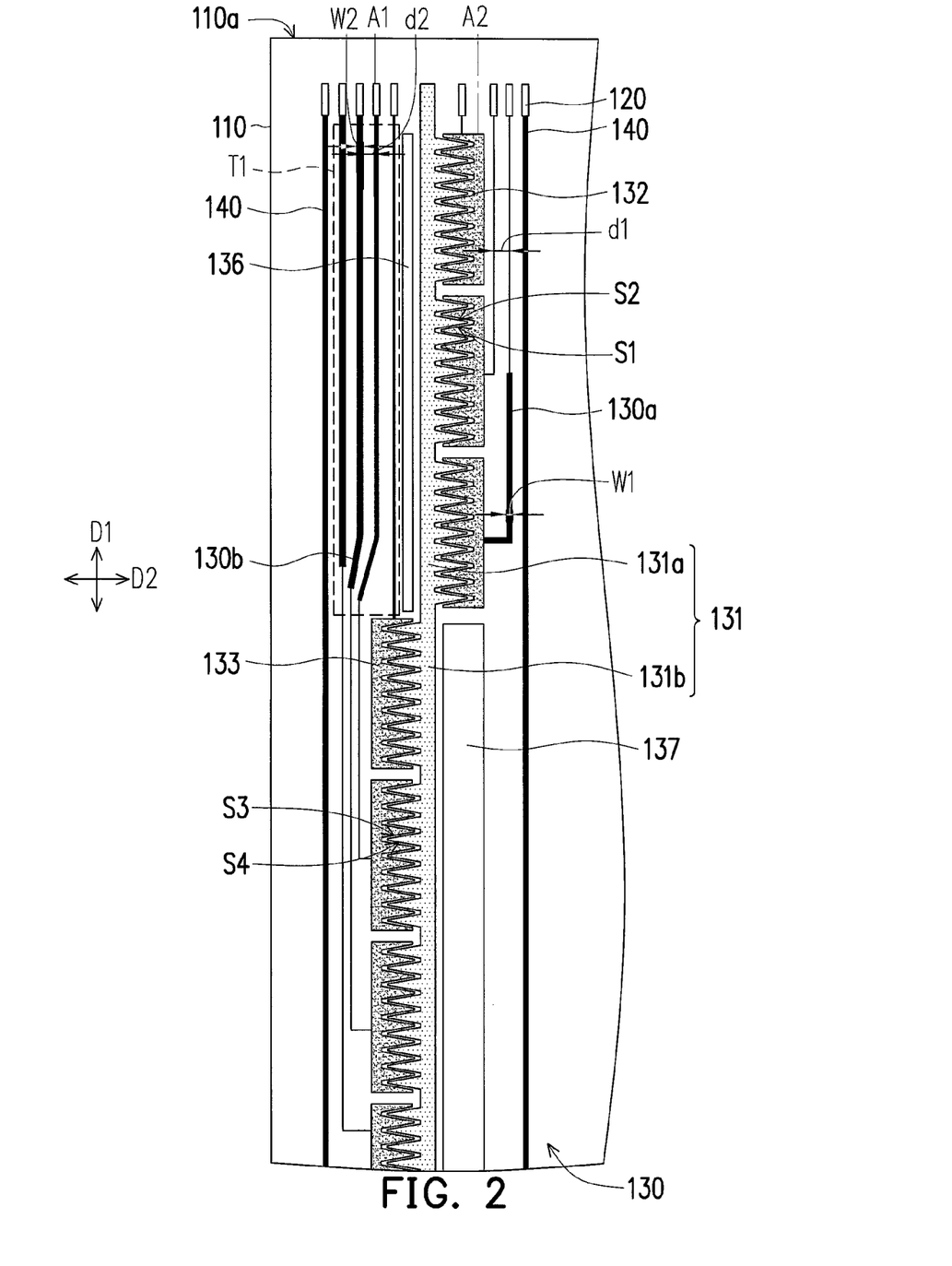
FIG. 2 is a schematic diagram illustrating circuit units depicted in FIG. 1.

FIG. 2 is a schematic diagram illustrating circuit units depicted in FIG. 1. Referring to FIG. 2, each circuit unit 130 includes a signal line 131, a plurality of first electrodes 132, a plurality of second electrodes 133, a plurality of first connecting lines 130*a* and a plurality of second connecting lines 130*b*. The signal line 131 is located at the center of the circuit units 130, and the signal line 131 extends along the first direction D1. The signal line 131 includes a first portion 131*a* and a second portion 131*b*. The first portion 131*a* is located between the first side 110*a* and the second portion 131*b*. The first electrodes 132 are disposed beside the first portion 131*a* of the signal line 131 and coupled with the first portion 131*a*. The second electrodes 133 are disposed beside the second portion 131*b* of the signal line 131 and coupled with the second portion 131*b*, and the first electrodes 132 and the second electrodes 133 are respectively located at the two opposite sides of the signal line 131.

In the configuration of FIG. 2, the first connecting lines 130*a* respectively connect the first electrodes 132 to the corresponding first connecting pads 120, and the second connecting lines 130*b* respectively connect the second electrodes 133 to the corresponding first connecting pads 120 through a trace region T1 located beside the first portion 131*a*. Wherein, the trace region T1 and the first electrodes 132 are respectively located at two opposite sides of the first portion 131*a*. The ground lines 140 are disposed on the substrate 110 and respectively extend along the first direction D1. Referring to FIG. 1, in the present embodiment, any two adjacent circuit units 130 have a ground line 140 therebetween, so as to avoid a phenomenon of signal interference from happening between the two adjacent circuit units 130.

In the present embodiment, the first electrodes 132 and the second electrodes 133 in each circuit unit 130 are respectively located at the two sides of the signal line 131. The first electrodes 132 are disposed beside the first portion 131*a*, the second electrodes 133 are disposed beside the second portion 131*b*, and the first portion 131*a* is located between the first side 110*a* and the second portion 131*b* of the substrate 110. Under such layout, one side of the first portion 131*a* are first electrodes 132, and the other side may be disposed with the trace region T1 passing by the second connecting lines 130*b*, so that an efficient use of the layout space may be achieved.

As illustrated in FIG. 2, the trace region T1 and the second electrodes 133 are all located on a first axis A1, and the first axis A1 is parallel to the first direction D1. In the present embodiment, the trace region T1 and the second electrodes 133 are located at the same side of the signal line 131, and since the layout of the present embodiment enables the space at the other side of the first portion 131*a* to be disposed with the trace region T1 passing by the second connecting lines 130*b*, the trace region T1 may be arranged on an axis A1 with the second electrodes 133. Namely, the trace region T1 can be arranged into a straight row and disposed at the same side of the signal line 131 with the second electrodes 133, so as to save the layout space of the substrate 110. A tracing method of each second connecting line 130*b* is as illustrated in FIG. 2, and an end of each second connecting line 130*b* is connected with the corresponding second electrode 133, while the other end is connected with the corresponding first pad 120. Each second connecting line 130*b* gets closer towards the trace region T1 starting from the end connected with the second electrode 133, and then is connected with the corresponding first pad 120 along the first direction D1 after passing through the trace region T1.

Since the trace region T1 passing by the second connecting lines 130*b* is located beside the first portion 131*a*, the second connecting lines 130*b* pass beside the first portion 131*a*. In order to avoid the second connecting lines 130*b* from mutual interfering with the first portion 131*a* of the signal line 131, there is a spacing between the two. However, the spacing may cause the touch panel 100 to have a situation of uneven light transmittance. For this reason, in the present embodiment, each circuit unit 130 of the touch panel 100 further includes a first dummy pattern 136 therein. The first dummy pattern 136 is disposed between the first portion 131*a* and the trace region T1, and may reduce the touch panel 100 from having the situation of uneven light transmittance. In addition, as illustrated in FIG. 2, each circuit unit 130 further includes a second dummy pattern 137 therein, the second dummy pattern 137 is disposed beside the second portion 131*b*, and the second dummy pattern 137 and the second electrodes 133 are respectively located at two opposite sides of the second portion 131*b*. A function of the second dummy pattern 137 is similar to that of the first dummy pattern 136, and thus is not repeated herein.

Referring to FIG. 2, following the above, the first electrodes 132 and the second dummy pattern 137 are all located on a second axis A2, and the second axis A2 is parallel to the first direction D1. In other words, second dummy pattern 137 and the first electrodes 132 are arranged in a straight row, and in the configuration of FIG. 2, the order from top to bottom is the first connecting pads 120, the first electrodes 132, and the second dummy pattern 137. In the present embodiment, the first electrodes 132 and the second dummy pattern 137 are located at the same side of the signal line 131; herein, in order to use the space on the substrate 110 more efficiently, the first electrodes 132 and the second dummy pattern 137 are all disposed on the axis A2. With the arrangement of the trace region T1 and the second electrodes 133, the space occupied by the circuit units 130 on the substrate 110 may further be saved.

Moreover, in the present embodiment, in order to adjust the impedance of a circuit layout on the substrate 110, each first connecting line 130*a* and each second connecting line 130*b* may have different linewidths w1, w2. Because distances between each first electrode 132 and each first pad 120 are different, the first electrode 132 farther from the first pad 120 requires the longer first connecting line 130*a* to connect the two together, while the first electrode 132 closer to the first pad 120 then requires the shorter first connecting line 130*a* to connect the two together. With the adjustment of the impedance, in the present embodiment, the linewidth w1 of the first connecting line 130*a* with shorter length is smaller than the linewidth w1 of the first connecting line 130*a* with longer length.

Similarly, distances between each second electrode 133 and each first pad 120 are also different, the second electrode 133 farther from the first pad 120 requires the longer second connecting line 130*b* to connect the two together, while the second electrode 133 closer to the first pad 120 then requires the shorter second connecting line 130*b* to connect the two together. In the present embodiment, the linewidth w2 of the second connecting line 130*b* with shorter length is smaller than the linewidth w2 of the second connecting line 130*b* with longer length.

Likewise, by adjusting the line distances between the first connecting lines 130*a* and the line distances between the second connecting lines 130*b*, the impedance and electroconductivity of the overall circuit layout are adjusted in the present embodiment. In other words, a line distance d1 between two adjacent first connecting lines 130*a* and a line distance d2 between two adjacent second connecting lines 130b are varied depending on different locations. In the present embodiment, the sizes of the linewidths w1, w2 and the line distances d1, d2 are concurrently used to adjust the impedance of the circuit layout on the substrate 110, and to increase a signal to noise ratio of the touch panel 100 during a signal transmission, such that the touch panel 100 can provide a user with favorable touch quality.

In the present embodiment, a material of the first connecting lines 130a and the second connecting lines 130b is a conductive transparent material, such as indium tin oxide (ITO), indium zinc oxide (IBO), Al doped zinc oxide (AGO) or indium oxide, or a combination thereof. When the first connecting lines 130a and the second connecting lines 130b are transparent, it is facilitative in enhancing the overall light transmittance of the touch panel 100.

Referring to FIG. 2, since the touch panel 100 operates an electronic device connected therewith through generating a change in capacitance at a location touched by a finger, and then calculating a suitable command based on the change in capacitance, how to increase a coupling capacitance between the first portion 131a and the first electrodes 132 and a coupling capacitance between the second portion 131b and the second electrodes 133 is one of the main design points of the touch panel 100. In the present embodiment, in order to increase the coupling capacitance between the first portion 131a and the first electrodes 132 corresponded to the first portion 131a, and to increase the coupling capacitance between the second portion 131b and the second electrodes 133 corresponded to the second portion 131b, for enhancing an operational sensitivity of the touch panel 100, the first electrodes 132 and the first portion 131a respectively have a plurality of complementary jagged structures s1, s2, and the second electrodes 133 and the second portion 131b respectively have a plurality of complementary jagged structures s3, s4.

In detail, the jagged structures s1 of the first electrodes 132 and the jagged structures s2 of the corresponding first portion 131a are in relative to each other, and the jagged structures s3 of the second electrodes 133 and the jagged structures s4 of the corresponding second portion 131b are also in relative to each other. The jagged structures s1 of the first electrodes 132 extend within the jagged structures s2 of the first portion 131a; and similarly, the jagged structures s3 of the second electrodes 133 extend within the jagged structures s4 of the second portion 131b. As a result, the coupling capacitance between the two may be increased.

In the touch panel 100, the ground lines 140 may be used to reduce the signal interference generated between each circuit unit 130. The first dummy pattern 136 and the second dummy pattern 137 then may enhance the light transmittance uniformity of the touch panel 100. The complementary jagged structures s1, s2 or the first portion 131a and the first electrodes 132, and the complementary jagged structures s3, s4 of the second portion 131b and the second electrodes 133, may enhance a sensing sensitivity of the touch panel 100. In addition, the designs of the linewidths w1, w2 and line distances d1, d2 of the first connecting lines 130a and the second connecting lines 130b may adjust an impedance matching of the circuit layout on the substrate 110 and achieve an effect of enhancing the signal ratio. Accordingly, with the aforementioned trace region T1, the touch panel 100 not only may effectively utilize the layout space but also can provide favorable touch quality.

Next, referring to FIG. 1, an amount of the second electrodes 133 in each circuit unit 130 is greater than an amount of the first electrodes 132. In the present embodiment, the amount of first electrodes 132 is three, and the amount of the second electrodes 133 is four, but the amount of each electrode in the application is not limited thereto. During the designing, the amount of the first electrodes 132 and the amount of the second electrodes 133 may be equal or unequal. When the amount of the first electrodes 132 is unequal to the amount of the second electrodes 133, the amount of the second electrodes 133 may be greater than the amount of the first electrodes 132. For instance, during the designing, if a total electrode amount (viz., the amount of the first electrodes 132 in addition with the amount of the second electrodes 133) is an even number, then the amount of the first electrodes 132 and the amount of the second electrodes 133 may design to be equal. Whereas, when the total electrode amount is an odd number, the amount of the second electrodes 133 is the amount of the first electrodes 132 plus 1. In other words, when the total electrode amount is the odd number, if the amount of the second electrodes 133 is N, then the amount of the first electrodes 132 is M, wherein N=M+1.

This design mainly takes into consideration of the trace spaces of the first connecting lines 130a connected to the first electrodes 132 and the second connecting lines 130b connected to the second electrodes 133. More specifically, since the trace space of the first connecting lines 130a has no adjustment of flexibility, and the second connecting lines 130b are connected to the corresponding first connecting pads 120 after passing through the trace region T1, the trace region T1 may be used to adjust the linewidth w2 of each passing by second connecting line 130b and the line distance d2 between each second connecting lines 130b, so that the impedance thereof may be adjusted and the touch panel 100 can provide a more favorable touch quality. As such, the amount of the second electrodes 133 may selectively be greater than the amount of the first electrodes 132 so as to strive for greater layout flexibility via the trace region T1.

Figure 3:
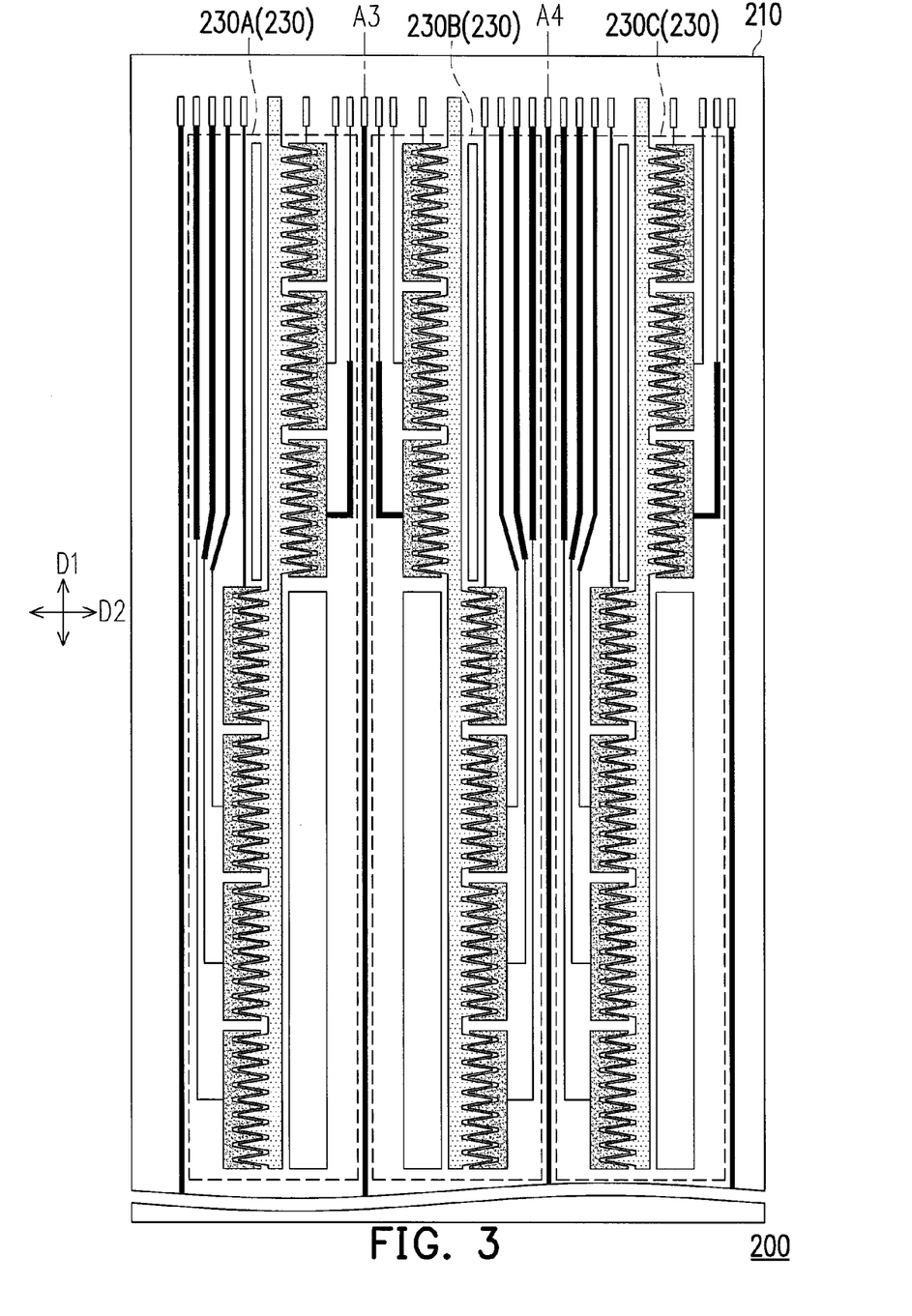
FIG. 3 is a schematic diagram illustrating a touch panel according to another embodiment of the application.

In addition, in the present embodiment, the circuit units 130 are alternatively and repeatedly arranged along the second direction D2. However, the arrangement of the circuit units 130 on the substrate 110 is not limited to the one illustrated in FIG. 1. FIG. 3 is a schematic diagram illustrating a touch panel according to another embodiment of the application. It is to be explained that, the function of each component of a touch panel 200 depicted in FIG. 3 is the same as in the previous embodiment, and the function and the configuration of each component in a plurality of circuit units 230 of the present embodiment are also the same as in the previous embodiment; therefore, the function and configuration of each component are not to be repeated herein.

The touch panel 200 and the touch panel 100 depicted in FIG. 1 are substantially similar, and a main difference between the two is an arrangement of the circuit units 230 on a substrate 210. Referring to FIG. 3, in the embodiment of FIG. 3, any two adjacent circuit units 230 are all symmetrical along an axis. For instance, two adjacent circuit units 230A and 230B are symmetrical to each other along an axis A3, the axis A3 is parallel to the first direction D1, the circuit unit 230B is also symmetrical to an adjacent circuit unit 230C along an axis A4, and the axis A4 is parallel to the first direction D1.

Furthermore, a structure of each circuit unit of the touch panel is not limited to the ones described in the previous two embodiments. For instance, each circuit unit may be a line-symmetric structure in relative to an axis parallel to the second direction D2; or each circuit unit has a center point, and the circuit unit may be a point-symmetric structure in relative to the center point. In the following, two situations when the circuit units are being the line-symmetric structure and the point-symmetric structure are described, together with figures and examples, below.

Figure 4:
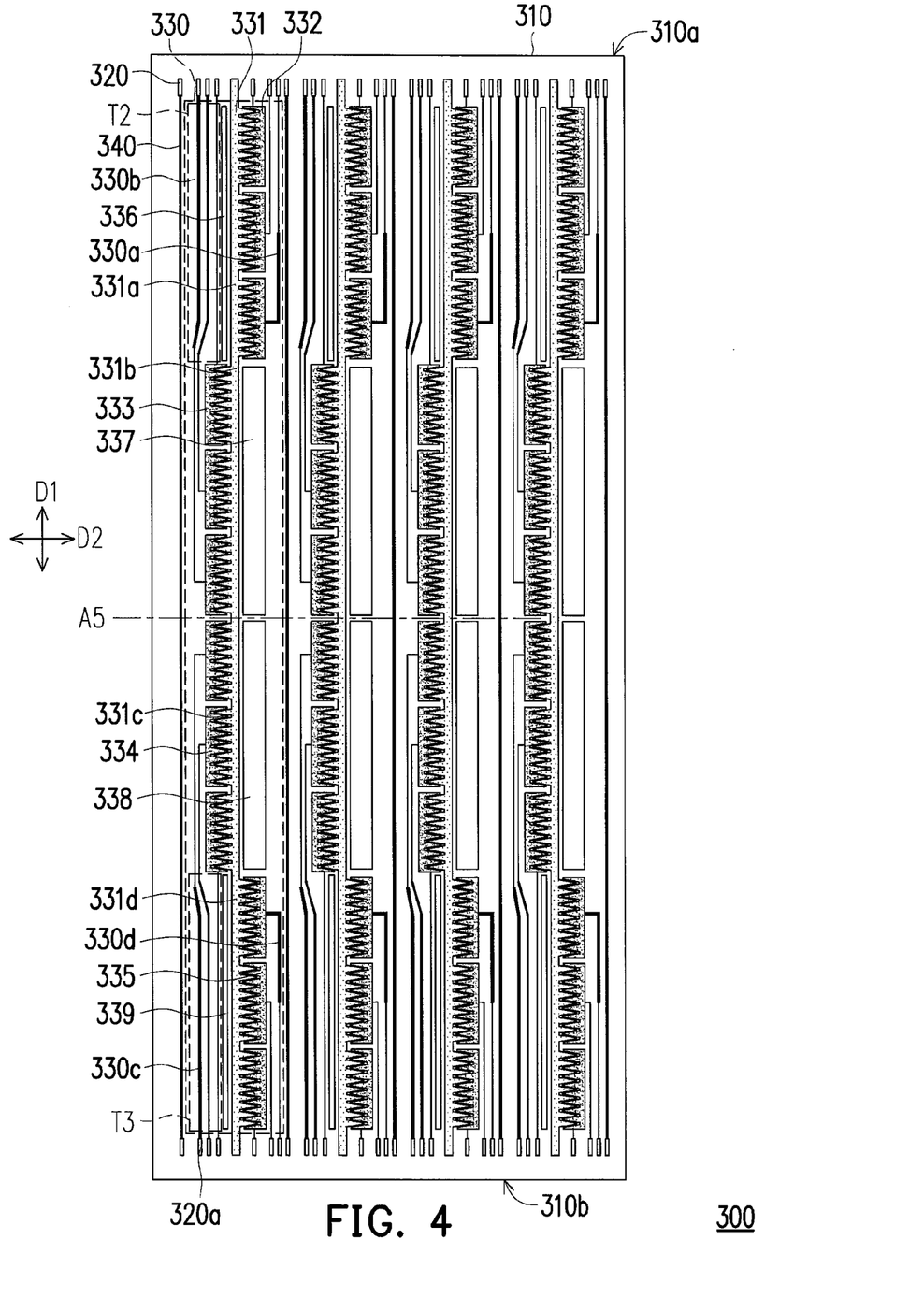
FIG. 4 is a schematic diagram illustrating a touch panel according to yet another embodiment of the application.

Firstly, the situation when each circuit unit being the line-symmetric structure is described below. FIG. 4 is a schematic diagram illustrating a touch panel according to yet another embodiment of the application. Referring to FIG. 4, in the present embodiment, each circuit unit 330 is a line-symmetric structure in relative to an axis A5, and the axis A5 is parallel to the second direction D2. In the present embodiment, an arrangement of a plurality of circuit units 330 on the substrate 310 is the same as the arrangement adopted in the first embodiment; namely, the circuit units 330 are alternatively and repeatedly arranged on the substrate 310 along the second direction D. It is to be explained that, even though the present embodiment has taken the arrangement of alternatively and repeatedly arranging the circuit units 330 along the second direction D2 as an example, but the application is not limited thereto. For instance, the circuit units 330 may also be arranged by adopting the arrangement illustrated in the embodiment of FIG. 3, such that any two adjacent circuit units 330 are both symmetrical along an axis.

Referring to FIG. 4, a touch panel 300 includes a substrate 310, a plurality of first connecting pads 320, a plurality of circuit units 330 and a plurality of ground lines 340. The substrate 310 has a first side 310a and a second side 310b opposite the first side 310a. The first connecting pads 320 are disposed on the substrate 310 and neighboring the first side 310a of the substrate 310. The circuit units 330 respectively extend between the first side 310a and the second side 310b along a first direction D1, and arranged side-by-side on the substrate 310 along a second direction D2. Wherein, the first direction D1 intersects the second direction D2.

Each circuit unit 330 includes a signal line 331, a plurality of first electrodes 332, a plurality of second electrodes 333, a plurality of first connecting lines 330a, a plurality of second connecting lines 330b, a first dummy pattern 336 and a second dummy pattern 337. The signal line 331 includes a first portion 331a and a second portion 331b. A trace region T2 and the second electrodes 333 are arranged into a straight row and disposed at a side of the signal line 331, and the first dummy pattern 336 is disposed between the trace region T2 and the first portion 331a. The first electrodes 332 and the second dummy pattern 337 are arranged into a straight row and disposed at the other side of the signal line 331.

The first connecting lines 330a respectively connect the first electrodes 332 to the corresponding first connecting pads 320, and the second connecting lines 330b respectively connect the second electrodes 333 to the corresponding first connecting pads 320 through a trace region T2 located beside the first portion 331a. The ground lines 340 are disposed on the substrate 310 and respectively extend along the first direction D1, and any two adjacent circuit units 330 have a ground line 340 therebetween.

Functions of the aforementioned components on the substrate 310 are the same as the components of the touch panel 100 illustrated in FIG. 1, and thus are not repeated herein.

The aforementioned components on the substrate 310 may be symmetrical along the axis A5 and formed into components of other portion.

As illustrated in FIG. 4, the first connecting pads 320 and the second connecting pads 320a are symmetrical to each other along the axis A5. The second connecting pads 320a are disposed on the substrate 310 and neighboring the second side 310b of the substrate 310.

The first portion 331a and the second portion 331b are respectively symmetrical to a third portion 331c and a fourth portion 331d of the signal line 331 along the axis A5, wherein the third portion 331c is connected to the second portion 331b and located between the second portion 331b and the second side 310b. The fourth portion 331d is connected to the third portion 331c and located between the third portion 331c and the second side 310b. The axis A5 passes through a junction of the second portion 331b and the third portion 331c as an axis of symmetry for each circuit unit 330.

The first electrodes 332 and the second electrodes 333 are respectively symmetrical to a plurality of third electrodes 334 and a plurality of fourth electrodes 335 along the axis A5. The third electrodes 334 are disposed beside the third portion 331c and coupled with the third portion 331c. As illustrated in FIG. 4, the second electrodes 333 and the third electrodes 334 are located at the same side of the signal line 331. The fourth electrodes 335 are disposed beside the fourth portion 331d and coupled with the fourth portion 331d, and the first electrodes 332 and the fourth electrodes 335 are located at the same side of the signal line 331.

In addition, first connecting lines 330a and a plurality of fourth connecting lines 330d are symmetrical to each other along the axis A5, and the second connecting lines 330b and a plurality of third connecting lines 330c are symmetrical to each other along the axis A5. The third connecting lines 330c respectively connect the third electrodes 334 to the corresponding second connecting pads 320a, and the fourth connecting lines 330d respectively connect the fourth electrodes 335 to the corresponding second connecting pads 320a.

In the present embodiment, the trace region T2 and a trace region T3 are symmetrical to each other along the axis A5. The trace region T3 is located beside the fourth portion 331d. The third connecting lines 330c respectively connect the third electrodes 334 to the corresponding second connecting pads 320a through the trace region T3. In the present embodiment, the trace region T3 and the fourth electrodes 335 are respectively located at two opposite sides of the fourth portion 331d.

A first dummy pattern 336 and a second dummy pattern 337 are respectively symmetrical to a third dummy pattern 338 and a fourth dummy pattern 339 along the axis A5. The third dummy pattern 338 is disposed beside the third portion 331c, and the third dummy pattern 338 and the third electrodes 334 are respectively located at two opposite sides of the third portion 331c. The fourth dummy pattern 339 is disposed between the fourth portion 331d and the third connecting lines 330c. In other words, the fourth dummy pattern 339 is disposed between the fourth portion 331d and the trace region T3. Herein, functions of the third dummy pattern 338 and the fourth dummy pattern 339 are the same as in the previous embodiments, and thus are not repeated.

Referring to FIG. 4, in the present embodiment, the trace region T2, the second electrodes 333, the third electrodes 334 and the trace region T3 are sequentially arranged into a straight row and disposed at a side of the signal line 331. The first electrodes 332, the second dummy pattern 337, the third dummy pattern 338 and the fourth electrodes 335 are sequentially arranged into a straight row and disposed at the other side of the signal line 331. Herein, functions of the trace regions T2, T3 are the same as in the previous embodiments, and thus are not repeated.

Figure 5:
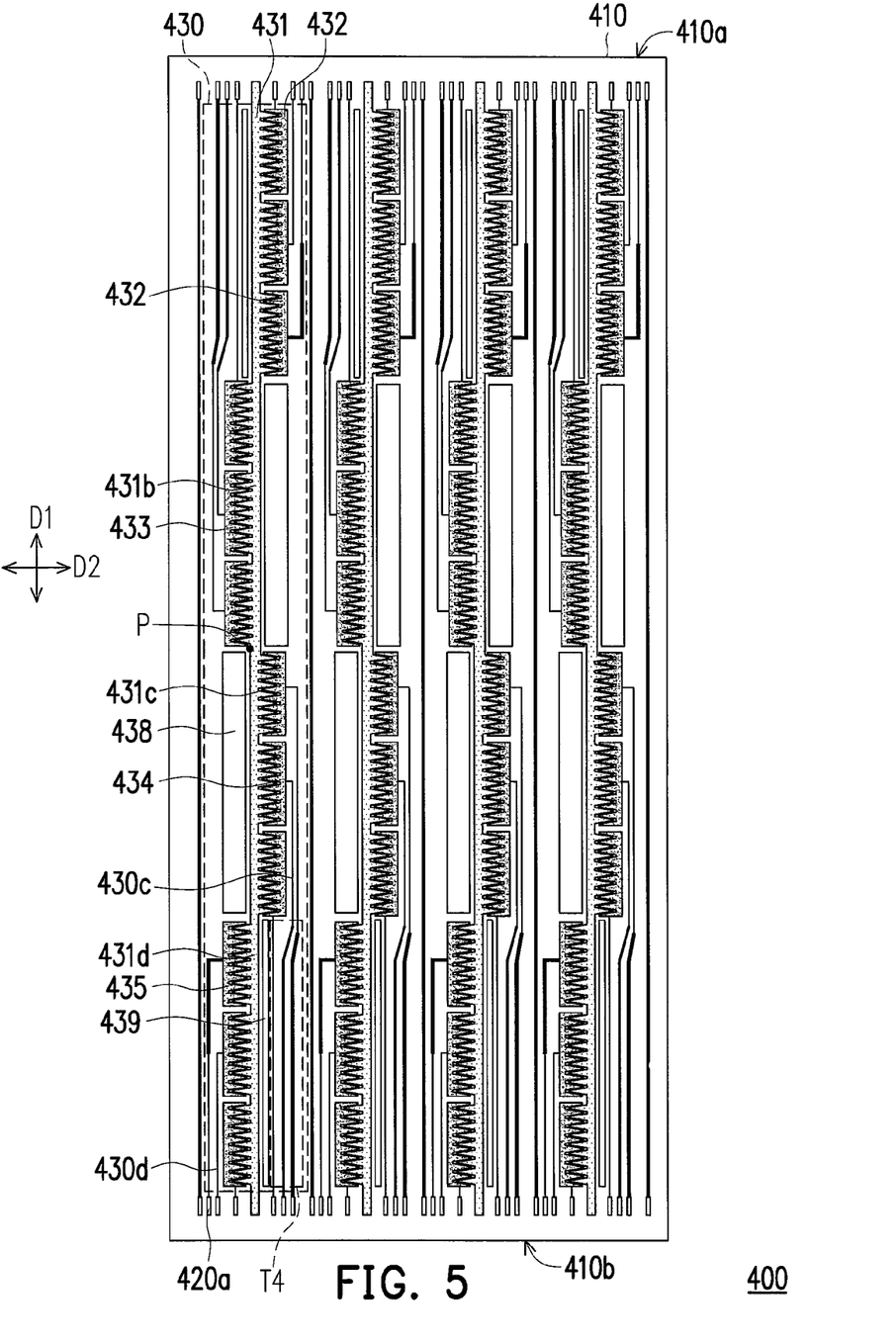
FIG. 5 is a schematic diagram illustrating a touch panel according to still another embodiment of the application.

The above is the embodiment of the circuit units being the line-symmetric structures; and in the following, the situation when each circuit unit being the point-symmetric structure is described, together with figures and examples, below. FIG. 5 is a schematic diagram illustrating a touch panel according to still another embodiment of the application. Referring to FIG. 5, in the present embodiment, each circuit unit 430 has a center point P, and each circuit unit 430 is a point-symmetric structure in relative to the center point P. In the present embodiment, an arrangement of a plurality of circuit units 430 is the same as the arrangement adopted in the embodiment of FIG. 1; namely, the circuit units 430 are alternatively and repeatedly arranged along the second direction D2. It is to be explained that, even though the present embodiment has taken the arrangement of alternatively and repeatedly arranging the circuit units 430 along the second direction D2 as an example, but the application is not limited thereto. For instance, the circuit units 430 may also be arranged by adopting the arrangement illustrated in the embodiment of FIG. 2, such that any two adjacent circuit units 430 are both symmetrical along an axis.

The embodiment of FIG. 5 is substantially similar to the embodiment of FIG. 4. Referring to FIG. 4 and FIG. 5 at the same time, a main difference between the point-symmetric circuit units and the line-symmetric circuit units is that, in the embodiment of point-symmetric circuit units, a plurality of third electrodes 434 and a plurality of first electrodes 432 are located at the same side of a signal line 431, while a plurality of fourth electrodes 435 and a plurality of second electrodes 433 are located at the other side of the signal line 431. Since locations of the third electrodes 434 and the fourth electrodes 435 are changed, locations of a plurality of third connecting lines 430c and a plurality of fourth connecting lines 430d connected therewith are also changed. Similarly, locations of a third dummy pattern 438 and a fourth dummy pattern 439 are changed.

The following mainly describes differences between the embodiment of FIG. 5 and the embodiment of FIG. 4, and similar parts between the two may be referred to the previous descriptions.

Referring to FIG. 5, a touch panel 400 of the present embodiment includes a plurality of first connecting pads 420 and a plurality of second connecting pads 420a disposed on a substrate 410. The first connecting pads 420 are neighboring a first side 410a of the substrate 410, and the second connecting pads 420a are neighboring a second side 410b of the substrate 410. In other words, in the present embodiment, the first connecting pads 420 are located at the first side 410a of the substrate 410, and the second connecting pads 420a are located at the second side 410b of the substrate 410, wherein the first side 410a opposites the second side 410b.

Each circuit unit 430 includes a third portion 431c of the signal line 431, a fourth portion 431d of the signal line 431, the third electrodes 434, the fourth electrodes 435, the third connecting lines 430c and the fourth connecting lines 430d. The third portion 431c is connected to a second portion 431b and located between the second portion 431b and the second side 410b. The fourth portion 431d is connected to the third portion 431c and located between the third portion 431c and the second side 410b.

The third electrodes 434 are disposed beside the third portion 431c and coupled to the third portion 431c, wherein the second electrodes 433 and the third electrodes 434 are located at the two opposite sides of the signal line 431. The f fourth electrodes 435 are disposed beside the fourth portion 431d and coupled with the fourth portion 431d, and the first electrodes 432 and the fourth electrodes 435 are located at the two opposite sides of the signal line 431.

The third connecting lines 430c respectively connect the third electrodes 434 to a plurality of corresponding second connecting pads 420a, and the fourth connecting lines 430d respectively connect the fourth electrodes 435 to the corresponding second connecting pads 420a.

In the fourth embodiment, the third connecting lines 430c respectively connect the third electrodes 434 to the corresponding second connecting pads 420a through a trace region T4 located beside the fourth portion 431d. The trace region T4 and the fourth electrodes 435 are respectively located at two opposite sides of the fourth portion 431d.

In addition, each circuit unit 430 further includes the third dummy pattern 438 and the fourth dummy pattern 439. The third dummy pattern 438 is disposed beside the third portion 431c, and the third dummy pattern 438 and the third electrodes 434 are respectively located two opposite sides of the third portion 431c. The fourth dummy pattern 439 is disposed between the fourth portion 431d and the third connecting lines 430c. In other words, the fourth dummy pattern 439 is disposed between the fourth portion 431d and the trace region T4. Herein, functions of the third dummy pattern 438 and the fourth dummy pattern 439 are the same as the previous embodiments, and thus are not repeated.

It is to be explained that, in the embodiment illustrated in FIG. 4 and FIG. 5, an amount of the first electrodes and an amount of the second electrodes are equal, and an amount of the third electrodes and an amount of the fourth electrodes are equal, for example, but the application is not limited thereto. When the amount of the first electrodes and the amount of the second electrodes are unequal, a configuration may be referred to the one illustrated in the embodiment of FIG. 1, and when the amount of the third electrodes and the amount of the fourth electrodes are unequal, then the amount of the third electrodes may be designed as greater than the amount of the fourth electrodes. The reason for those amounts is the same as for the amounts designed for the first electrodes and the second electrodes, and thus are not repeated herein.

In terms of a large size touch panel, if the connecting pads are only disposed at the first side of the substrate, then the lengths of the connecting lines are too long, thereby causing the electroconductivity of the touch panel to become poor. Therefore, the embodiment illustrated in FIG. 4 and FIG. 5 may be applied to the large size touch panel. In more detail, since the first connecting pads and the second connecting pads are respectively disposed at the first side and the second side of the substrate, the touch panel that adopts this embodiment can maintain sufficient touch definition. Furthermore, since the first connecting lines and the second connecting lines are connected to the first connecting pads, and the third connecting lines and the fourth connecting lines are connected to the first connecting pads, this type of touch panel can maintain favorable electroconductivity.

In summary, in a display unit of the touch panel of the application, the first electrodes and the second electrodes are respectively located the two sides of the signal line, and the first electrodes are closer to the first connecting pads than the second electrodes. With such layout, via disposing the trace region passing through by the second connecting lines at a side of the signal line and opposite to the first electrodes, the effective use of the layout space is achieved.

In addition, the ground lines in the touch panel may reduce the signal interference between each circuit unit, whereas each dummy pattern may improve problems produced during the manufacturing process or enhance the light transmittance uniformity of the touch panel. The jagged structures having by each portion of the signal line and the electrodes coupled therewith have may increase the coupling capacitance between the two and enhance the sensing sensitivity of the touch panel. As for the circuits of the touch pane, the linewidth and line distance design of each connecting line may adjust the impedance of the circuit layout. Accordingly, with the aforementioned trace region, the touch panel of the application, in addition to effectively using the layout space, may also provide favorable touch quality.

Moreover, the structure of each circuit unit has a variety of different forms, such as point-symmetric or line-symmetric. In addition, the circuit units have different arrangements on the substrate. For instance, the circuit units may be alternatively and repeatedly arranged along the second direction, or any two adjacent circuit units may be symmetrical to each other along an axis.

As such, the touch panel of the application has favorable design flexibility.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A touch panel comprising:
    a substrate, having a first side and a second side opposite the first side;
    a plurality of first connecting pads, disposed on the substrate and adjacent to the first side of the substrate;
    a plurality of circuit units, respectively extending between the first side and the second side along a first direction which extends from the first side to the second side, and arranged side-by-side on the substrate along a second direction, the first direction intersecting the second direction, and each circuit unit comprising:
        a signal line, extending along the first direction, the signal line comprising a first portion and a second portion, the first portion located between the first side and the second portion;
        a plurality of first electrodes, disposed beside the first portion of the signal line and coupled with the first portion;
        a plurality of second electrodes, disposed beside the second portion of the signal line and coupled with the second portion, wherein the first electrodes and the second electrodes respectively located at the two opposite sides of the signal line, and the first electrodes are closer to the first connecting pads than the second electrodes;
        a plurality of first connecting lines, respectively connecting the first electrodes to the corresponding first connecting pads;
        a plurality of second connecting lines, passing through a trace region located beside the first portion and respectively connecting the second electrodes to the corresponding first connecting pads, the trace region and the first electrodes respectively located at two opposite sides of the first portion; and
    a plurality of ground lines, disposed on the substrate and respectively extending along the first direction, wherein any two adjacent circuit units are provided with one of the ground lines therebetween.

2. The touch panel as recited in claim 1, wherein the trace region and the second electrodes are all located on a first axis, and the first axis is parallel to the first direction.

3. The touch panel as recited in claim 1, wherein each circuit unit further comprises a first dummy pattern disposed between the first portion and the trace region.

4. The touch panel as recited in claim 1, wherein each circuit unit further comprises a second dummy pattern disposed beside the second portion, and the second dummy pattern and the second electrodes are respectively located at two opposite sides of the second portion.

5. The touch panel as recited in claim 4, wherein the first electrodes and the second dummy pattern are all located on a second axis, and the second axis is parallel to the first direction.

6. The touch panel as recited in claim 1, wherein linewidths of the first connecting lines with shorter length are smaller than linewidths of the first connecting lines with longer length.

7. The touch panel as recited in claim 1, wherein linewidths of the second connecting lines with shorter length are smaller than linewidths of the second connecting lines with longer length.

8. The touch panel as recited in claim 1, wherein each first electrode and the first portion respectively have a plurality of complementary jagged structures, and each second electrode and the second portion respectively have a plurality of complementary jagged structures.

9. The touch panel as recited in claim 1, wherein an amount of the second electrodes is greater than an amount of the first electrodes.

10. The touch panel as recited in claim 1, wherein the signal line of each of the circuit units is located in the center of the circuit unit.

11. The touch panel as recited in claim 1, wherein the circuit units are alternatively and repeatedly arranged along the second direction.

12. The touch panel as recited in claim 1, wherein any two adjacent circuit units are symmetrical to each other along an axis, and the axis is parallel to the first direction.

13. The touch panel as recited in claim 1, wherein each circuit unit is a line-symmetric structure with respect to an axis, and the axis is parallel to the second direction.

14. The touch panel as recited in claim 13 further comprising a plurality of second connecting pads disposed on the substrate and neighboring the second side of the substrate, each circuit unit further comprising:
    a third portion of the signal line, connected to the second portion and located between the second portion and the second side, and the axis passing through a junction of the second portion and the third portion;
    a fourth portion of the signal line, connected to the third portion and located between the third portion and the second side;
    a plurality of third electrodes, disposed beside the third portion and coupled with the third portion, and the second electrodes and the third electrodes located on the same side of the signal line;
        a plurality of fourth electrodes, disposed beside the fourth portion and coupled with the fourth portion, and the first electrodes and the fourth electrodes located on the same side of the signal line;
        a plurality of third connecting lines, respectively connecting the third electrodes to the corresponding second connecting pads; and
        a plurality of fourth connecting lines, respectively connecting the fourth electrodes to the corresponding second connecting pads.

15. The touch panel as recited in claim 14, wherein each circuit unit further comprising a third dummy pattern disposed beside the third portion, and the third dummy pattern and the third electrodes are respectively located at two opposite sides of the third portion.

16. The touch panel as recited in claim 14, wherein each circuit unit further comprising a fourth dummy pattern disposed between the fourth portion and the third connecting lines.

17. The touch panel as recited in claim 1, wherein each circuit unit has a center point, and each circuit unit is a point-symmetric structure with respect to the center point.

18. The touch panel as recited in claim 17 further comprising a plurality of second connecting pads disposed on the substrate and neighboring the second side of the substrate, each circuit unit further comprising:
   a third portion of the signal line, connected to the second portion and located between the second portion and the second side;
   a fourth portion of the signal line, connected to the third portion and located between the third portion and the second side;
      a plurality of third electrodes, disposed beside the third portion and coupled with the third portion, and the second electrodes and the third electrodes located at the two opposite sides of the signal line;
      a plurality of fourth electrodes, disposed beside the fourth portion and coupled with the fourth portion, and the first electrodes and the fourth electrodes located at the two opposite sides of the signal line;
   a plurality of third connecting lines, respectively connecting the third electrodes to the corresponding second connecting pads; and
   a plurality of fourth connecting lines, respectively connecting the fourth electrodes to the corresponding second connecting pads.

19. The touch panel as recited in claim 18, wherein each circuit unit further comprising a third dummy pattern disposed beside the third portion, and the third dummy pattern and the third electrodes are respectively located at two opposite sides of the third portion.

20. The touch panel as recited in claim 18, wherein each circuit unit further comprises a fourth dummy pattern disposed between the fourth portion and the third connecting lines.

* * * * *